US012768904B2

(12) United States Patent
Yoshida et al.

(10) Patent No.: US 12,768,904 B2
(45) Date of Patent: Oct. 20, 2026

(54) GROUND FAULT DETECTION APPARATUS, CONTROL METHOD THEREOF, AND CONTROL PROGRAM

(71) Applicant: Yazaki Corporation, Tokyo (JP)

(72) Inventors: Haruhiko Yoshida, Makinohara (JP); Yasuyuki Mochizuki, Makinohara (JP); Ryosuke Arigaya, Makinohara (JP)

(73) Assignee: Yazaki Corporation, Tokyo (JP)

( * ) Notice: Subject to any disclaimer, the term of this patent is extended or adjusted under 35 U.S.C. 154(b) by 176 days.

(21) Appl. No.: 18/797,016

(22) Filed: Aug. 7, 2024

(65) Prior Publication Data

US 2025/0076409 A1 Mar. 6, 2025

(30) Foreign Application Priority Data

Sep. 4, 2023 (JP) ................................ 2023-142714

(51) Int. Cl.
*G01R 31/52* (2020.01)
*G01R 27/20* (2006.01)
*B60L 3/00* (2019.01)

(52) U.S. Cl.
CPC ........... *G01R 31/52* (2020.01); *G01R 27/205* (2013.01); *B60L 3/0069* (2013.01)

(58) Field of Classification Search
CPC ...................................................... G01R 31/52
See application file for complete search history.

(56) References Cited

U.S. PATENT DOCUMENTS

| | | | | |
|---|---|---|---|---|
| 11,703,536 | B2 * | 7/2023 | Loder | G01R 31/1272 324/426 |
| 2020/0319261 | A1 * | 10/2020 | Kawamura | G01R 31/52 |
| 2021/0270910 | A1 | 9/2021 | Yamaguchi | |
| 2023/0048778 | A1 | 2/2023 | Mochizuki et al. | |

FOREIGN PATENT DOCUMENTS

| | | |
|---|---|---|
| JP | 2004-170103 A | 6/2004 |
| JP | 2016-99323 A | 5/2016 |

* cited by examiner

*Primary Examiner* — Tung X Nguyen
(74) *Attorney, Agent, or Firm* — Sughrue Mion, PLLC

(57) ABSTRACT

A control method of a ground fault detection apparatus for detecting a decrease in an insulation resistance of a system including a battery that is not grounded and a Y capacitor includes an insulation-resistance-decrease detection step of controlling a switching portion to measure a charging voltage of the first capacitor and to perform a detection of a decrease in the insulation resistance based on the measured charging voltage of the first capacitor, wherein the insulation-resistance-decrease detection step is initiated when a first period has elapsed from a startup process for starting up the ground fault detection apparatus is finished.

9 Claims, 8 Drawing Sheets

GROUND FAULT DETECTION APPARATUS, CONTROL METHOD THEREOF, AND CONTROL PROGRAM

TECHNICAL FIELD

The present disclosure relates to a ground fault detection apparatus, a control method thereof and a non-volatile computer-readable recording medium recording a control program.

BACKGROUND ART

Recently, hybrid cars and electric cars are becoming popular. The hybrid cars and the electric cars are equipped with an electric motor and a battery that supplies power to the electric motor. The Battery installed in the hybrid vehicles and electric vehicles is a high-voltage battery having a voltage equal to or more than 200V, and in order to ensure the safety thereof, it is necessary to make the battery to be electrically insulated from the vehicle body, which serves as a reference potential point for grounding. Therefore, the vehicles such as the hybrid cars and the electric cars are also equipped with a ground fault detection apparatus that detects a decrease in the insulation resistance between a system including the battery that is not grounded and the vehicle body.

As a ground fault detection apparatus, there is a flying capacitor type ground fault detection apparatus (for example, Patent Document 1). A flying capacitor type ground fault detection apparatus has a capacitor that operates as a flying capacitor, and the ground fault detection apparatus switches among a first charging route in which this capacitor is connected between the cathode and the anode of the battery without going through the ground; a second charging route in which the capacitor is connected between the cathode of the battery and the ground; a third charging route in which the capacitor is connected between the anode of the battery and the ground; and a measurement route for measuring the charging voltage of the first capacitor so as to perform the charging of the capacitor and the measurement for the charging voltage of the capacitor, and detect a decrease in the insulation resistance based on this measured charging voltage of the capacitor.

CITATION LIST

Patent Documents

[Patent Document 1] JP 2004-170103A

SUMMARY OF THE INVENTION

Technical Problem

Generally, for decreasing the noise of a common mode, a Y capacitor is connected to a system including the battery. Regarding the second charging route and the third charging route, the voltages of the Y capacitors enter a nonequilibrium state. Generally, the measurement of the insulation resistance is based on an assumption that the voltages of the Y capacitors are in an equilibrium state. Accordingly, there is a possibility that the measurement accuracy of the values of the insulation resistances which are measured based on the charging voltage of the capacitor which is charged when the voltages of the Y capacitors are in the nonequilibrium state, becomes lower. Therefore, after the measurement in the second charging route and the measurement in the third charging route, the process proceeds to switch to other charging route by waiting for that the voltages of the Y capacitors reach the equilibrium state.

According to the ground fault detection apparatus, generally, a startup process for starting up the ground fault detection apparatus is performed before the detection for the decrease in the insulation resistance. In this startup process, there is a case in which the voltages of the Y capacitors enter the nonequilibrium state, however, conventionally, the nonequilibrium state of the Y capacitors after this startup process it not taken into consideration.

Accordingly, an object of the present invention is to accurately detect the decrease in the insulation resistance.

Solution to Problem

In order to solve the above-identified technical problem, a ground fault detection apparatus according to an embodiment of the present application is a ground fault detection apparatus for detecting a decrease in an insulation resistance of a system including a Y capacitor and a battery that is not grounded, wherein the ground fault detection apparatus includes a first capacitor; a switching portion configured to switch among a first charging route in which the first capacitor is connected between a cathode and an anode of the battery without being connected to the ground, a second charging route in which the first capacitor is connected between the cathode of the battery and the ground, a third charging route in which the first capacitor is connected between the anode of the battery and the ground, and a measurement route for measuring a charging voltage of the first capacitor; and a control portion configured to control the switching portion to measure the charging voltage of the first capacitor, wherein the control portion is configured to initiate the detection for the decrease in the insulation resistance after a first period has elapsed from a startup process for starting up the ground fault detection apparatus is finished.

A control method according to an embodiment of the present invention is a control method of a ground fault detection apparatus for detecting a decrease in an insulation resistance of a system including a Y capacitor and a battery that is not grounded, the control method being executed by a computer, wherein the ground fault detection apparatus includes a first capacitor; and a switching portion configured to switch among a first charging route in which the first capacitor is connected between a cathode and an anode of the battery without being connected to the ground, a second charging route in which the first capacitor is connected between the cathode of the battery and the ground, a third charging route in which the first capacitor is connected between the anode of the battery and the ground, and a measurement route for measuring a charging voltage of the first capacitor, and the control method includes an insulation-resistance-decrease detection step of controlling the switching portion to measure a charging voltage of the first capacitor and to detect a decrease in the insulation resistance based on the measured charging voltage of the first capacitor, wherein the insulation-resistance-decrease detection step is initiated after a first period has elapsed from a startup process for starting up the ground fault detection apparatus is finished.

A non-volatile computer-readable recording medium recording a control program according to an embodiment of the present invention causes the above-identified information processing method to be executed by a computer.

Effect of the Invention

According to the present invention, it is possible to accurately perform a detection of the decrease in the insulation resistance.

DESCRIPTION OF EMBODIMENTS

<Ground Fault Detection Apparatus 100>

Figure 1:
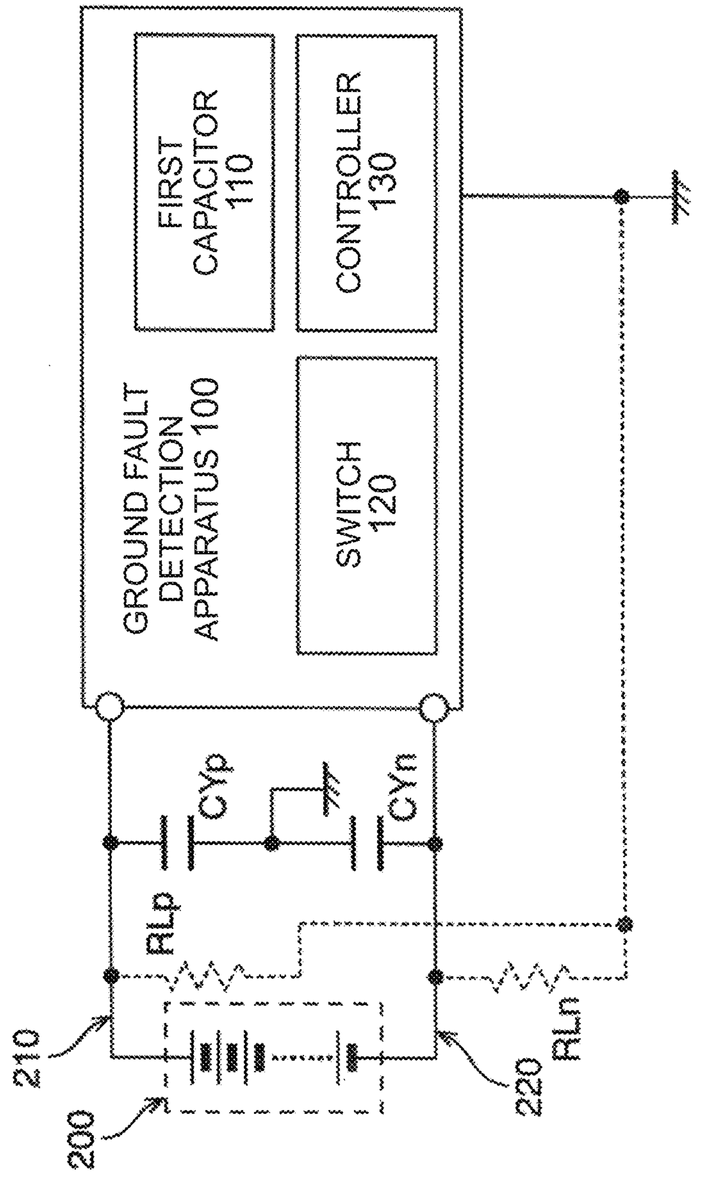
FIG. 1 is a view showing a ground fault detection apparatus 100 according to an embodiment of the present invention.

FIG. 1 is a view showing a ground fault detection apparatus 100 according to an embodiment of the present invention. The ground fault detection apparatus 100 is a flying-capacitor type of ground fault detection apparatus which is connected to a battery 200 that is not grounded to detect a decrease in an insulation resistance of a system including the battery 200. Here, the insulation resistance between a cathode side of the battery 200 and the ground is referred to as a cathode-side insulation resistance RLp, and the insulation resistance between an anode side of the battery 200 and the ground is referred to as an anode-side insulation resistance RLn.

The battery 200 is, for example, a battery for supplying electric power to the electric motor of the vehicle, and is a high voltage (for example, 200V or higher) battery. The battery 200 includes, for example, a plurality of rechargeable batteries (for example, the lithium-ion batteries). The cathode side of the battery 200 is connected to a cathode-side power line 210, and the anode side of the battery 200 is connected to a anode-side power line 220.

A system including the battery 200 is connected with an Y capacitor for decreasing the noise due to the common-mode. In the example shown in FIG. 1, a cathode-side Y capacitor CYp is connected between the cathode-side power line 210 and the ground, and an anode-side Y capacitor CYn is connected between the anode-side power line 220 and the ground. The cathode-side Y capacitor CYp includes the stray capacity between the cathode-side power line 210 and the ground, and the anode-side Y capacitor CYn includes the stray capacity between the anode-side power line 220 and the ground.

The ground fault detection apparatus 100 is connected to the cathode of the battery 200 via the cathode-side power line 210 and connected to the anode of the battery 200 via the anode-side power line 220. The ground fault detection apparatus 100 includes a first capacitor 110, a switching portion 120, and a control portion 130.

The first capacitor 110 is a capacitor having a first electrode plate and a second electrode plate and configured to operate as a flying capacitor.

The switching portion 120 is configured to switch among a first charging route where the first capacitor 110 is connected between the cathode and the anode of the battery 200 without being grounded, a second charging route where the first capacitor 110 is connected between the cathode of the battery 200 and the ground, a third charging route where the first capacitor 110 is connected between the anode of the battery 200 and the ground, and a measurement route for measuring the charging voltage of the first capacitor 110.

Regarding the first charging route, the first capacitor 110 is charged due to an electric current flowing through a closed circuit in which the cathode of the battery 200, the first capacitor 110, and the anode of the battery 200 are connected in series in this sequence without being grounded. Accordingly, in the first charging route, a first charging voltage V0 corresponding to the charging voltage of the battery 200 is charged to the first capacitor 110.

Regarding the second charging route, the first capacitor 110 is charged due to an electric current flowing through a closed circuit in which the cathode of the battery 200, the first capacitor 110, the anode-side insulation resistance RLn, and the anode of the battery 200 are connected in series in this sequence. Accordingly, in the second charging route, a second charging voltage VC1*n* reflecting the effect of the anode-side insulation resistance RLn is charged to the first capacitor 110.

Regarding the third charging route, the first capacitor 110 is charged due to an electric current flowing through a closed circuit in which the cathode of the battery 200, the cathode-side insulation resistance RLp, the first capacitor 110, and the anode of the battery 200 are connected in series in this sequence. Accordingly, in the third charging route, a third charging voltage VC1*p* reflecting the effect of the cathode-side insulation resistance RLp is charged to the first capacitor 110.

The control portion 130 is configured to measure the charging voltage of the first capacitor 110. The control portion 130, for example, controls the switching portion 120 to measure, in a measurement route, the first charging voltage V0 as the charging voltage of the first capacitor 110 that is charged by the first charging route, the second charging voltage VC In as the charging voltage of the first capacitor 110 that is charged by the second charging route, and the third charging voltage VC1*p* as the charging voltage of the first capacitor 110 that is charged by the third charging route.

Then, the control portion 130 performs the detection of the decrease in the insulation resistances RLp, RLn (detection of the ground fault) based on the measured charging voltage of the first capacitor 110. For example, the control portion 130 detects the decrease in the insulation resistances RLp, RLn based on the first charging voltage V0, the second charging voltage VC1*n*, and the third charging voltage VC1*p*. At this time, the control portion 130, for example, measures the values of the insulation resistances RLp, RLn based on the charging voltages of the first capacitor 110 and then detects the decrease in the insulation resistances RLp, RLn based on the measured values of the insulation resistances RLp, RLn. For example, the control portion 130 is configured by a computer.

The control portion 130 detects the decrease of the insulation resistances RLp, RLn within each measurement cycle. That is, the control portion 130 repeats the measurement cycle for detecting the decrease of the insulation resistances RLp, RLn. At this time, the control portion 130, for example, measures the values of the insulation resistances RLp, RLn for each measurement cycle, and then detects the decrease of the insulation resistances RLp, RLn by comparing the values of the insulation resistances RLp, RLn which are measured during the current measurement cycle with the values of the insulation resistances RLp, RLn which are measured during the measurement cycle prior to the current measurement cycle (for example, the measurement cycle immediately before the current measurement cycle).

The measurement cycle includes a first measurement period (V0 measurement period) in which the first capacitor 110 is charged by the first charging route, and then the first charging voltage V0 as the charging voltage of the first capacitor 110 being charged by the first charging route is measured while discharging the first capacitor 110 by the measurement route, a second measurement period (VC1*n* measurement period) in which the first capacitor 110 is charged by the second charging route, and then the second charging voltage VC1*n* as the charging voltage of the first capacitor 110 being charged by the second charging route is measured while discharging the first capacitor 110 by the measurement route, and a third measurement period (VC1*p* measurement period) in which the first capacitor 110 is charged by the third charging route, and then the third charging voltage VC1*p* as the charging voltage of the first capacitor 110 being charged by the third charging route is measured while discharging the first capacitor 110 by the measurement route. In other words, for each measurement cycle, the control portion 130 measures the first charging voltage V0, the second charging voltage VC1*n*, and the third charging voltage VC1*p*, and then performs the detection of the decrease in the insulation resistances based on the measured first charging voltage V0, the second charging voltage VC1*n*, and the third charging voltage VC1*p*. During the measurement cycle, the above-described measurement period is realized, for example, in the sequence of the first measurement period, the second measurement period, the first measurement period, and the third measurement period.

When an abnormality occurs (for example, the timing when the decrease in the insulation resistances RLp, RLn is detected), the control portion 130 notifies the occurrence of the abnormality (for example, the decrease in the insulation resistances RLp, RLn). At this time, the control portion 130 may be configured to notify the occurrence of the abnormality by showing information indicating the occurrence of the abnormality using an indication apparatus showing the information (for example, a display and a lamp), or be configured to notify the occurrence of the abnormality by outputting a sound indicating the occurrence of the abnormality using an indication apparatus outputting the sound showing the information (for example, a speaker), or be configured to notify the occurrence of the abnormality by transmitting information indicating the occurrence of the abnormality to another apparatus (for example, a superior ECU (Electronic Control Unit)) using a communication apparatus to transmit the information to the other apparatus.

The control portion 130 may be configured to notify the values of the measured insulation resistances RLp, RLn. In this manner, it is possible for a person achieving the information by this notification and other apparatus achieving the information by this notification, rather than the control portion 130, to detect the decrease in the insulation resistances RLp, RLn.

Configuration Example of Ground Fault Detection Apparatus 100

Figure 2:
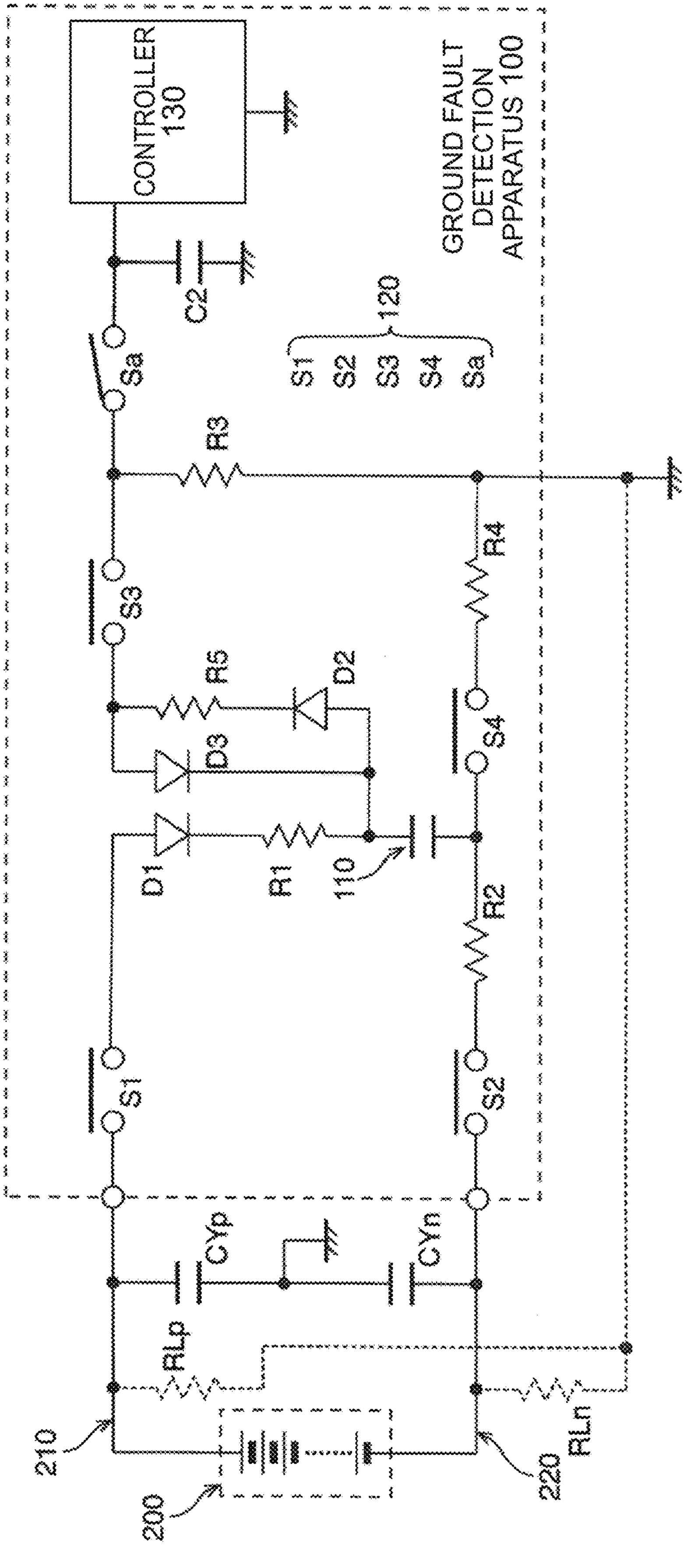
FIG. 2 is a view showing a configurational example of the ground fault detection apparatus 10.

For example, as shown in FIG. 2, the switching portion 120 may be configured to include four switches (a first switch S1, a second switch S2, a third switch S3, and a fourth switch S4). These four switches are insulation type of switching elements (for example, the optical MOSFET).

The first switch S1 is connected between the cathode of the battery 200 and a first electrode plate of the first capacitor 110. At this time, as shown in FIG. 2, the first switch S1 is connected to the first electrode plate of the first capacitor 110 via a first resistance R1. Also, a first diode D1 may be connected between the first switch S1 and the first resistance R1, or between the first resistance R1 and the first capacitor 110. A forward direction of the first diode D1 is a direction from the cathode of the battery 200 toward the first electrode plate of the first capacitor 110. In the configuration example shown in FIG. 2, the first diode D1 is connected between the first switch S1 and the first resistance R1.

The second switch S2 is connected between the anode of the battery 200 and a second electrode plate of the first capacitor 110. A second resistance R2 may be configured to be connected between the second switch S2 and a second electrode plate of the first capacitor 110, or between the second switch S2 and the anode of the battery 200. In the configuration example shown in FIG. 2, the second resistance R2 is connected between the second switch S2 and the second electrode plate of the first capacitor 110.

The third switch S3 is connected between the first electrode plate of the first capacitor 110 and the ground. At this time, as shown in FIG. 2, the third switch S3 is connected to the ground via a third resistance R3. Also, a second diode D2 and a third diode D3 may be connected in parallel between the third switch S3 and the first electrode plate of the first capacitor 110. The forward direction of the second diode D2 is a direction from the first electrode plate of the first capacitor 110 toward the third switch S3. The forward direction of the third diode D3 is a direction from the third switch S3 toward the first electrode plate of the first capacitor 110. Between the third switch S3 and the first electrode plate of the first capacitor 110, a fifth resistance R5 may be connected thereto in series with the second diode D2. In the configuration example shown in FIG. 2, the fifth resistance R5 is connected to the cathode side of the second diode D2.

The fourth switch S4 is connected between the second electrode plate of the first capacitor 110 and the ground. As shown in FIG. 2, the fourth switch S4 is connected to the ground via the fourth resistance R4.

Figure 3:
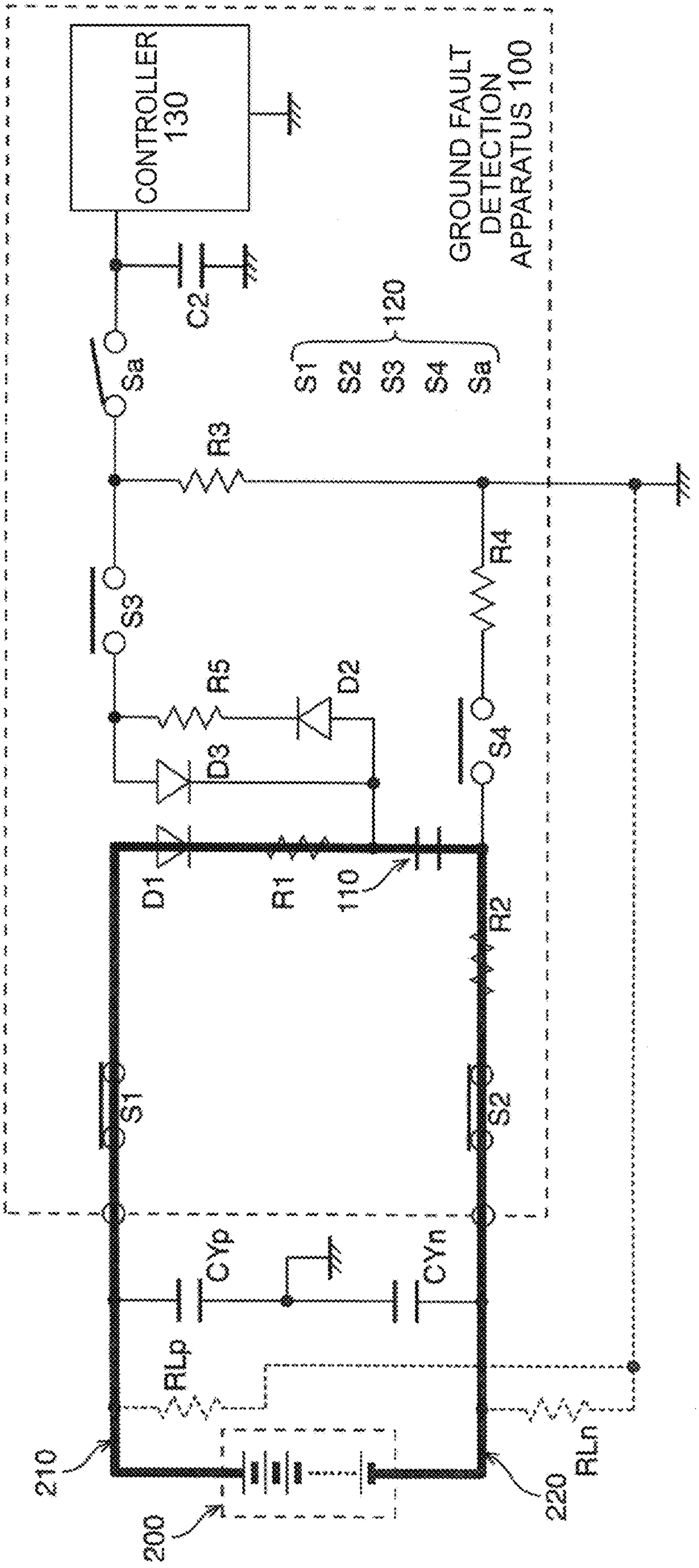
FIG. 3 is a view describing a first charging route.

Accordingly, in the configuration example shown in FIG. 2, when the first switch S1 and the second switch S2 are on, and the third switch S3 and the fourth switch S4 are off, as shown in FIG. 3, the first charging route, in which the first capacitor 110 is connected between the cathode and the anode of the battery 200 without being grounded, is formed. In the configuration example shown in FIG. 2, according to the first charging route, due to the closed circuit in which the cathode of the battery 200, the first switch S1, the first diode D1, the first resistance R1, the first capacitor 110, the second resistance R2, the second switch S2, and the anode of the battery 200 are connected in series and in this sequence, the first capacitor 110 is charged. Accordingly, regarding the first charging route, the first charging voltage V0 corresponding to the charging voltage of the battery 200 is charged on the first capacitor 110.

Figure 4:
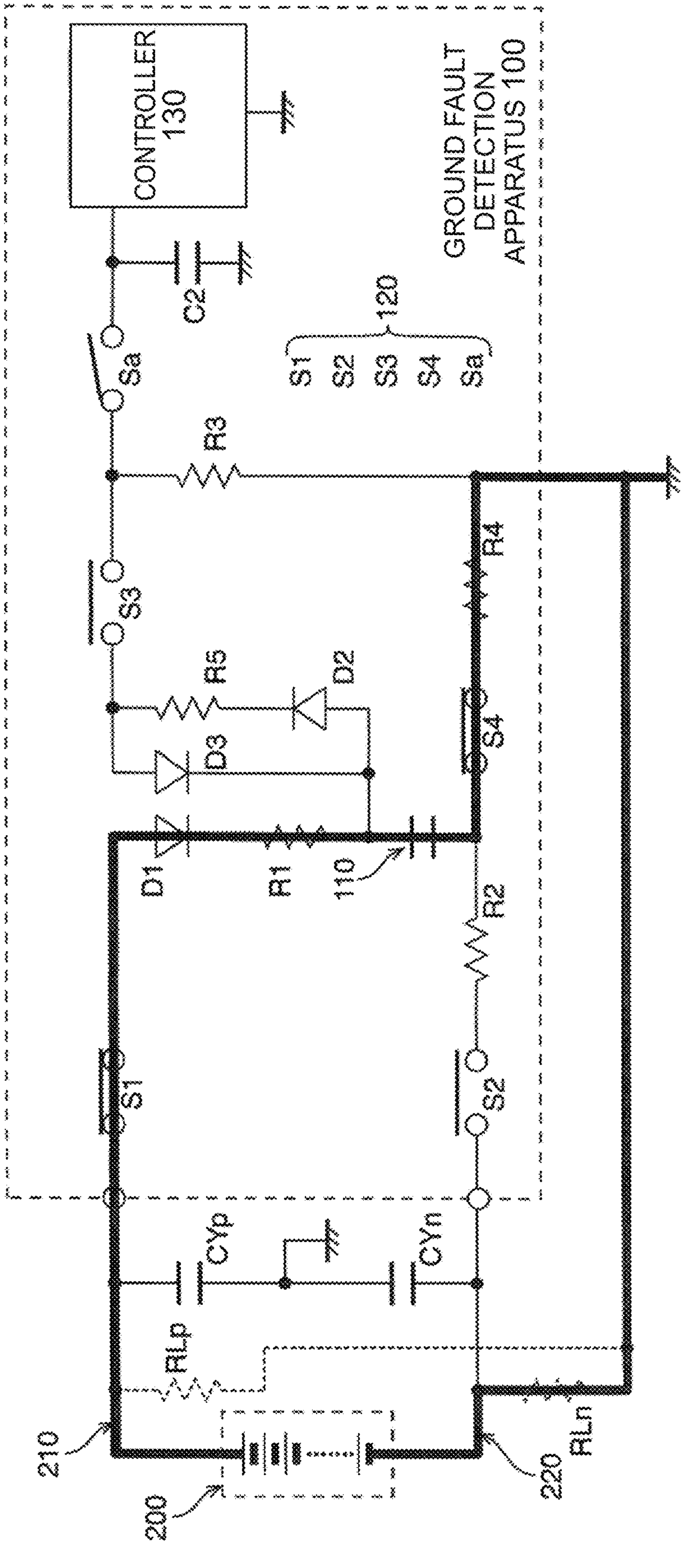
FIG. 4 is a view describing a second charging route.

Also, in the configuration example shown in FIG. 2, when the first switch S1 and the fourth switch S4 are on, and the second switch S2 and the third switch S3 are off, as shown in FIG. 4, the second charging route, in which the first capacitor 110 is connected between the cathode of the battery 200 and the ground, is formed. In the configuration example shown in FIG. 2, according to the second charging route, due to the closed circuit in which the cathode of the battery 200, the first switch S1, the first diode D1, the first resistance R1, the first capacitor 110, the fourth switch S4, the fourth resistance R4, the anode-side insulation resistance RLn, and the anode side of the battery 200 are connected in series and in this sequence, the first capacitor 110 is charged. Accordingly, in the second charging route, the second charging voltage VC1*n* reflecting the effect of the anode-side insulation resistance RLn of the battery 200 is charged on the first capacitor 110.

Figure 5:
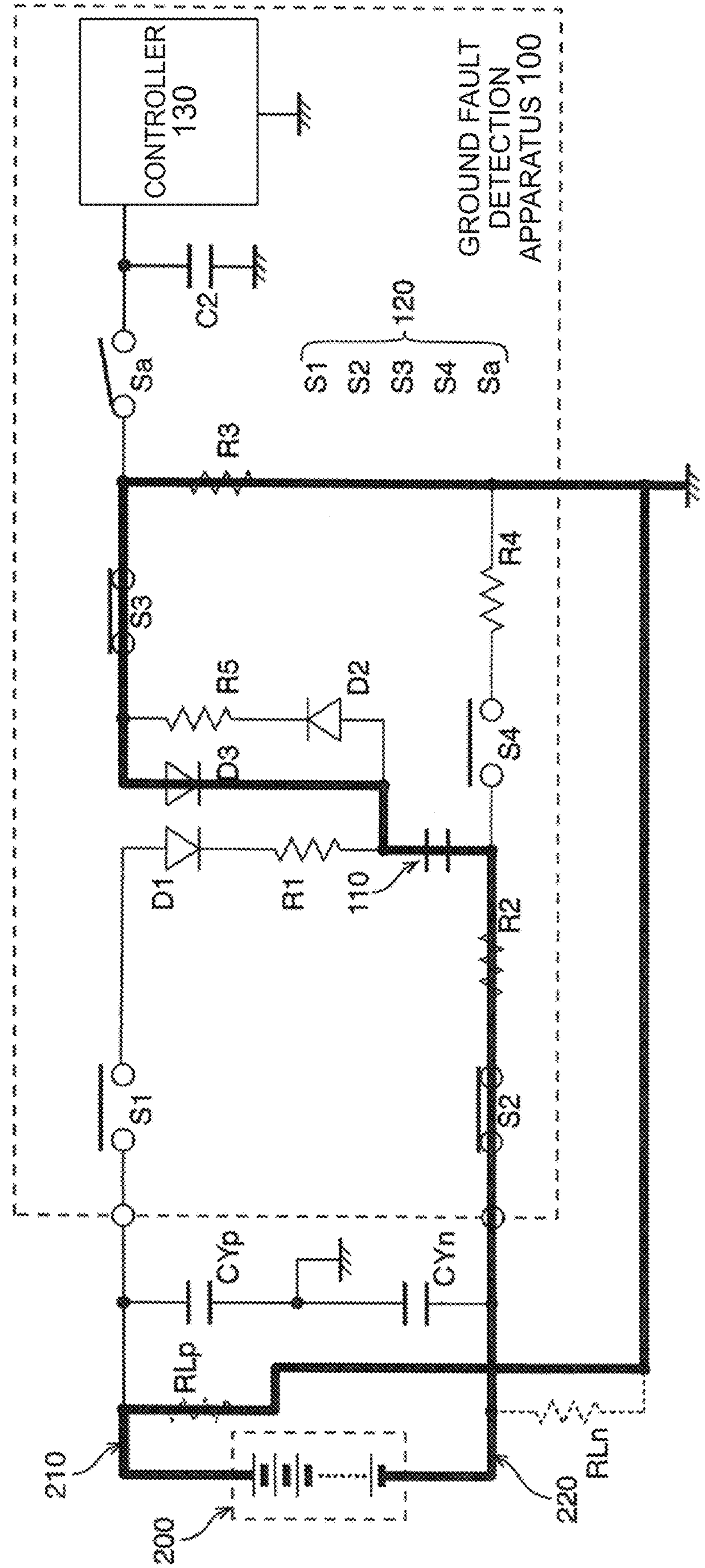
FIG. 5 is a view describing a third charging route.

In the configuration example shown in FIG. 2, when the second switch S2 and the third switch S3 are on, and the first switch S1 and the fourth switch S4 are off, as shown in FIG. 5, the third charging route, in which the first capacitor 110 is connected between the anode of the battery 200 and the ground, is formed. In the configuration example shown in FIG. 2, in the third charging route, due to the closed circuit in which the cathode of the battery 200, the cathode-side insulation resistance RLp, the third resistance R3, the third switch S3, the third diode D3, the first capacitor 110, the second resistance R2, the second switch S2, and the anode of the battery 200 are connected in series in this sequence, the first capacitor 110 is charged. Accordingly, in the third charging route, the third charging voltage VC1*p* reflecting the effect of the cathode-side insulation resistance RLp of the battery 200 is charged on the first capacitor 110.

Figure 6:
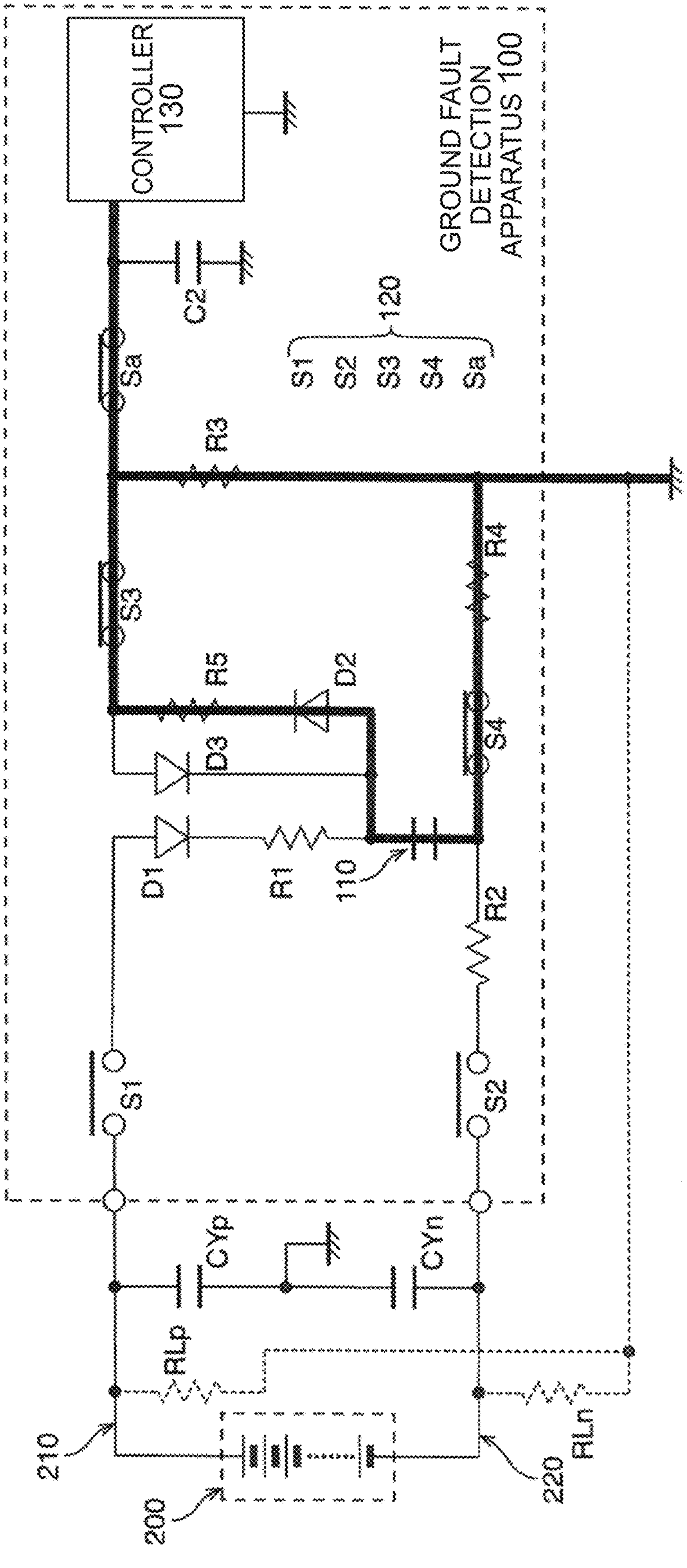
FIG. 6 is a view describing a measurement route.

As shown in FIG. 2, the control portion 130 is connected to the first electrode plate of the first capacitor 110. Accordingly, when the third switch S3 and the fourth switch S4 are on, and the first switch S1 and the second switch S2 are off, as shown in FIG. 6, the electric current flows from the first electrode plate of the first capacitor 110 to the control portion 130. Accordingly, it is possible for the control portion 130 to measure a charging voltage of a detection capacitor C1. That is, when the third switch S3 and the fourth switch S4 are on, and the first switch S1 and the second switch S2 are off, the measurement route for measuring the charging voltage of the first capacitor 110 is formed. As shown in FIG. 2, the line connecting the third switch S3 and the control portion 130 may be grounded via a second capacitor C2.

Also, as shown in FIG. 6, in the measurement route, the electric current flows from the first electrode plate to the second electrode plate of the first capacitor 110. Accordingly, in the measurement route, the first capacitor 110 is discharged.

Figure 7:
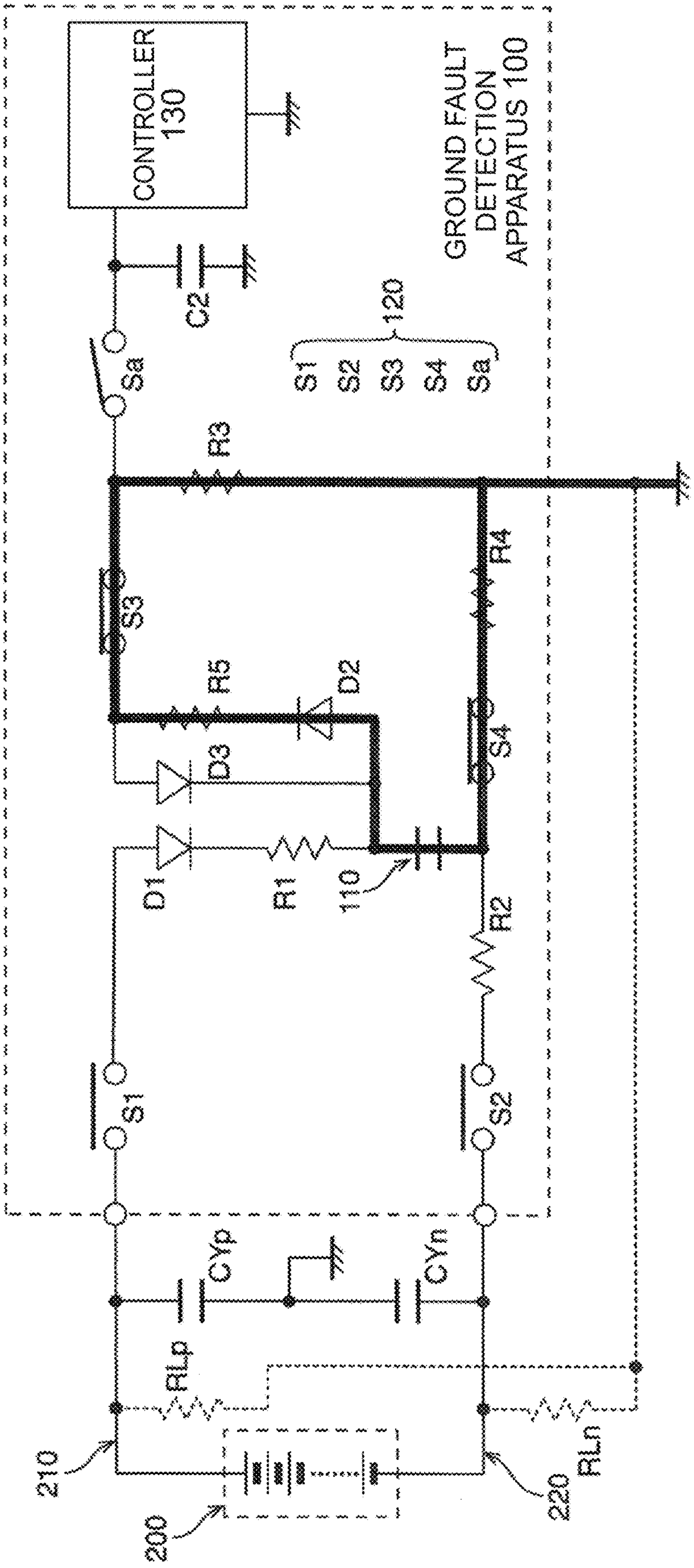
FIG. 7 is a view describing a discharging route.

As shown in FIG. 2, the switch portion 120 may be configured to further include a measurement switch Sa. In this manner, when the third switch S3, the fourth switch S4, and the measurement switch Sa are on, and the first switch S1 and the second switch S2 are off, as shown in FIG. 6, the measurement route for measuring the charging voltage of the first capacitor 110 is formed. Then, when the third switch S3 and the fourth switch S4 are on, and the first switch S1, the second switch S2, and the measurement switch Sa are off, as shown in FIG. 7, the discharging route in which the control portion 130 is separated from the first capacitor 110 for discharging the first capacitor 110 is formed. In the first charging route, the second charging route, and the third charging route, as shown in FIGS. 3-5, the measurement switch Sa are set to be off.

<Process after Startup Process>

In the second charging route and the third charging route, the voltages of the Y capacitor CYp and the Y capacitor CYn are in a nonequilibrium state. Generally, the measurement of the insulation resistances RLp, RLn is based on an assumption that the charging of the first capacitor 110 is initiated when the voltages of the Y capacitor CYp, CYn are in an equilibrium state. Accordingly, there is a possibility that the measurement accuracy of the values of the insulation resistances RLp, RLn, which are measured based on the charging voltage of the first capacitor 110 whose charging is initiated when the voltages of the Y capacitors CYp, CYn are in the nonequilibrium state, becomes lower. Therefore, after the second charging voltage VC1*n* and the third charging voltage VC1*p* have been measured, the process proceeds to switch to other charging route by waiting for that the voltages of the Y capacitors CYp, CYn reach the equilibrium state.

According to the ground fault detection apparatus 100, generally, a startup process for starting up the ground fault detection apparatus 100 is performed before the detection for the decrease in the insulation resistance RLp, RLn by the repetition of the measurement cycle. In the startup process, there is a case in which the voltages of the Y capacitors CYp, CYn enter the nonequilibrium state, however, conventionally, the capacities of the Y capacitors CYp, CYn are not so large and the process of waiting for that the voltages of the Y capacitors CYp, CYn reach the equilibrium state after the startup process is not performed. However, recently, the capacities of the Y capacitors CYp, CYn become large and a period for waiting for that the voltages of the Y capacitors CYp, CYn reach the equilibrium state after the voltages of the Y capacitors CYp, CYn have entered the nonequilibrium state becomes longer.

Therefore, in the present embodiment, the control portion 130 initiates the detection for the decrease in the insulation resistance RLp, RLn after a first period T1 from the startup process has elapsed. At this time, for example, the first period T1 is a time constant t of the circuit forming of the insulation resistances RLp, RLn, and the Y capacitors CYp, CYn which is calculated by the following equation based on a combined resistance value RL of the insulation resistances RLp, RLn and a combined capacity CY of the Y capacitors CYp, CYn.

$$T1 = \tau = RL \cdot CY \qquad \text{[Math 1]}$$

Accordingly, according to the present embodiment, when the Y capacitors CYp, CYn enter the equilibrium state, the measurement of the values of the insulation resistances RLn, RLp is performed. As a result, the measurement accuracy of the values of the insulation resistances RLn, RLp is improved, and it becomes possible to accurately detect the decrease in the insulation resistance.

Also, the first period T1 may be calculated by multiplying the time constant t by a predetermined constant A as the following equation.

$$T1 = A \cdot \tau = A \cdot RL \cdot CY \qquad \text{[Math 2]}$$

Here, the predetermined constant A is, for example, the safety factor.

The predetermined constant A is, for example, set such that the voltages of the Y capacitors CYp, CYn enter the equilibrium state until the measurement period which is performed at first, among the measurement periods other than the first measurement period (V0 measurement period) (the second measurement period (VC1*n* measurement period) or the third measurement period (VC1*p* measurement period)) in the first measurement cycle, is initiated. For example, in the case in which each measurement period in the measurement cycle is performed in a sequence as the first measurement period, the second measurement period, the first measurement period, and the third measurement period, for example, the predetermined constant A is set such that the voltages of the Y capacitors CYp, CYn enter the equilibrium state until the second measurement period as the measurement period which is performed at first among the measurement periods other than the first measurement period is initiated.

It is preferable to make the startup process to include an insulation resistance measurement process (for example, the above-described measurement cycle) for measuring the insulation resistances RLp, RLn. Also, it is preferable to calculate the combined resistance value of the insulation resistances RLp, RLn based on the values of the insulation resistances RLp, RLn which are measured by this insulation resistance measurement process.

Figure 8:
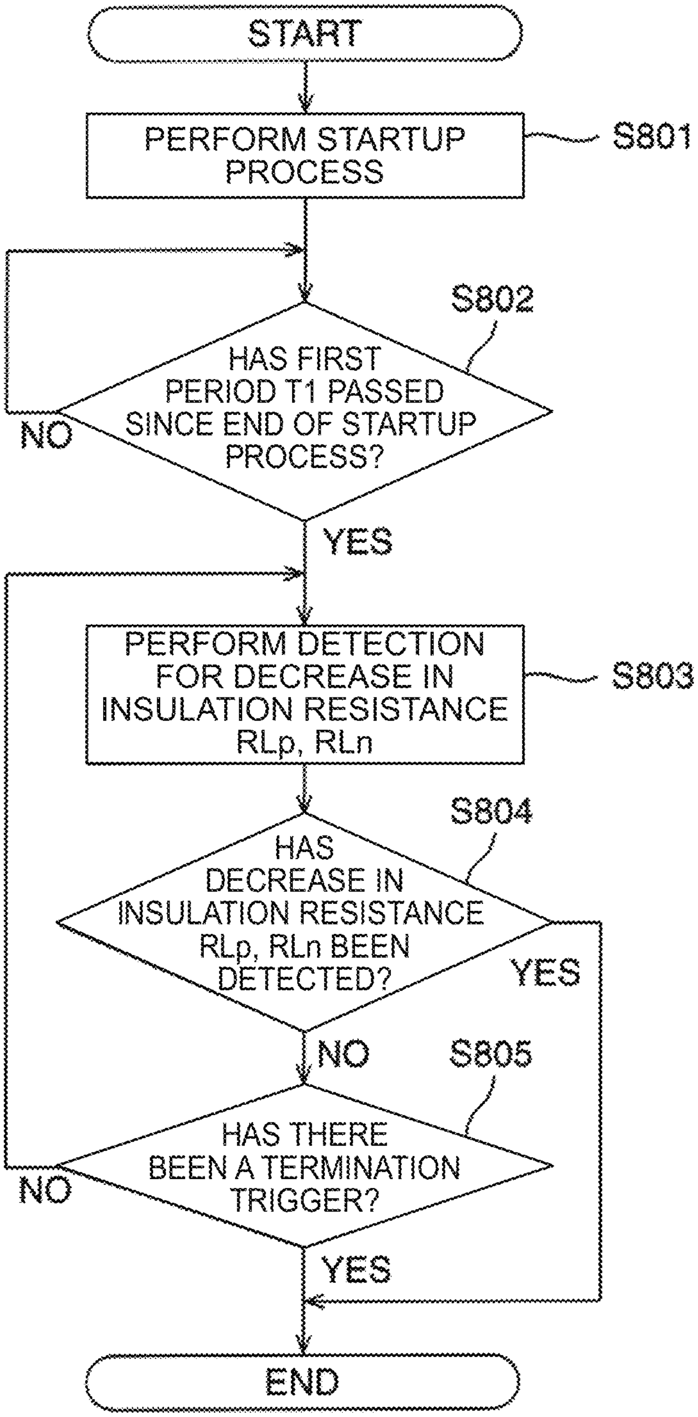
FIG. 8 is an example of the processing operations executed in the ground fault detection apparatus 100 after a startup of the ground fault detection apparatus 100.

FIG. 8 is a view showing an example of the process operations that are executed in the ground fault detection apparatus 100 after the starting up of the ground fault detection apparatus 100. The ground fault detection apparatus 100 performs the startup process (Step S801). After a first period T1 has elapsed from the end of the startup process (Step S802, YES), the detection (measurement cycle) for the decrease in the insulation resistances RLp, RLn is initiated to detect the decrease in the insulation resistances RLp, RLn (Step S804, YES), or until there is a termination trigger (Step S805, YES), the detection (measurement cycle) for the decrease in the insulation resistances RLp, RLn is repeated (Step S803).

The present invention has been described above using preferred embodiments of the present invention. Although the present invention has been described herein with reference to specific examples, various modifications and changes can be made to these examples without departing from the spirit and scope of the invention as set forth in the claims.

REFERENCE SIGNS LIST

100 ground fault detection apparatus
110 first capacitor
120 switching portion
130 control portion
200 battery
210 cathode-side power line
220 anode-side power line

What is claimed is:

1. A ground fault detection apparatus for detecting a decrease in an insulation resistance of a system including a battery that is not grounded and a Y capacitor, comprising:
- a first capacitor;
- a switching portion configured to switch among
  - a first charging route in which the first capacitor is connected between a cathode and an anode of the battery without being connected to the ground,
  - a second charging route in which the first capacitor is connected between the cathode of the battery and the ground,
  - a third charging route in which the first capacitor is connected between the anode of the battery and the ground, and
  - a measurement route for measuring a charging voltage of the first capacitor; and
- a control portion configured to control the switching portion to measure the charging voltage of the first capacitor,
- wherein the control portion is configured to initiate a detection for the decrease in the insulation resistances when a first period has elapsed from an end of a startup process for staring up the ground fault detection apparatus.

2. The ground fault detection apparatus according to claim 1, wherein the first period is calculated based on a value of the insulation resistance and a capacity of the Y capacitor.

3. The ground fault detection apparatus according to claim 2, wherein the first period is calculated by multiplying a combined resistance value of a cathode-side insulation resistance and an anode-side insulation resistance of the insulation resistance by a combined capacity of a cathode-side Y capacitor and an anode-side Y capacitor of the Y capacitor.

4. The ground fault detection apparatus according to claim 3, wherein the first period is calculated by multiplying the combined resistance value of the cathode-side insulation resistance and the anode-side insulation resistance of the insulation resistance, by the combined capacity of the cathode-side Y capacitor and the anode-side Y capacitor of the Y capacitor and a predetermined constant value.

5. The ground fault detection apparatus according to claim 4, wherein the predetermined constant value is a safety factor.

6. The ground fault detection apparatus according to claim 5, wherein the control portion is configured to perform the detection for the decrease in the insulation resistance, and
- wherein the measurement cycle includes
  - a first measurement period to charge the first capacitor in the first charging route and measure a first charging voltage which is the charging voltage of the first capacitor that is charged by the first charging route, in the measurement route,
  - a second measurement period to charge the first capacitor in the second charging route and measure a second charging voltage which is the charging voltage of the first capacitor that is charged by the second charging route, in the measurement route, and
  - a third measurement period to charge the first capacitor in the third charging route and measure a third charging voltage which is the charging voltage of the first capacitor that is charged by the third charging route, in the measurement route, and
- the predetermined constant is set such that the voltages of the Y capacitors enter an equilibrium state until a measurement period being performed at first among the measurement periods other than the first measurement period is initiated.

7. The ground fault detection apparatus according to claim 2,
- wherein the startup process includes an insulation resistance measurement process for measuring the value of the insulation resistance, and the value of the insulation resistance used in the calculation of the first period is the value of the insulation resistance measured by the insulation resistance measurement process.

8. A control method of a ground fault detection apparatus for detecting a decrease in an insulation resistance of a system including a battery that is not grounded and a Y capacitor, the control method being executed by a computer, the ground fault detection apparatus comprising:

a first capacitor; and a switching portion configured to switch among a first charging route in which the first capacitor is connected between a cathode and an anode of the battery without being connected to the ground, a second charging route in which the first capacitor is connected between the cathode of the battery and the ground, a third charging route in which the first capacitor is connected between the anode of the battery and the ground, and a measurement route for measuring a charging voltage of the first capacitor, the control method comprising an insulation-resistance-decrease detection step of controlling the switching portion to measure a charging voltage of the first capacitor and to perform a detection of a decrease in the insulation resistance based on the measured charging voltage of the first capacitor, wherein the insulation-resistance-decrease detection step is initiated when a first period has elapsed from a startup process for starting up the ground fault detection apparatus is finished.

9. A non-volatile computer-readable recording medium recording an information processing program for making a computer to execute the control method according to claim 8.

* * * * *